United States Patent [19]
Dai

[11] Patent Number: 5,670,281
[45] Date of Patent: Sep. 23, 1997

[54] MASKS AND METHODS OF FORMING MASKS WHICH AVOID PHASE CONFLICT PROBLEMS IN PHASE SHIFTING MASKS

[75] Inventor: Chang-Ming Dai, Hsinchu, Taiwan

[73] Assignee: Industrial Technology Research Institute, Hsinchu, Taiwan

[21] Appl. No.: 665,327

[22] Filed: Jun. 17, 1996

[51] Int. Cl.[6] .................................................. G03F 9/00
[52] U.S. Cl. ................................ 430/5; 430/311; 430/314
[58] Field of Search ................................. 430/5, 311, 314, 430/322, 323, 324

[56] References Cited

U.S. PATENT DOCUMENTS

| | | | |
|---|---|---|---|
| 5,318,868 | 6/1994 | Hasegawa et al. | 430/5 |
| 5,468,578 | 11/1995 | Rolfson | 430/5 |

OTHER PUBLICATIONS

"Phase–Shifting Mask Strategies: Isolated Dark Lines" by Marc D. Levenson, Microlithography World, Mar. 1992, pp. 6–12.

"Phase–Shifting Mask Strategies: Line–Space Pattern" by Marc D. Levenson Microlithography World, Sep 1992, pp. 6–12.

*Primary Examiner*—S. Rosasco
*Attorney, Agent, or Firm*—George O. Saile; Larry J. Prescott

[57] ABSTRACT

Masks and methods of forming the masks for avoiding phase conflict problems in phase shifting masks used to form a number of parallel line and space patterns on a semiconductor wafer using positive photoresist. The mask uses phase shifting material between alternating pairs of parallel opaque lines. Opaque fine tips formed as extensions to the opaque parallel lines on the mask prevent phase conflict from causing bridging at the ends of the lines. The methods of forming the masks use part of the transparent substrate or an added layer as the phase shifting material.

27 Claims, 9 Drawing Sheets

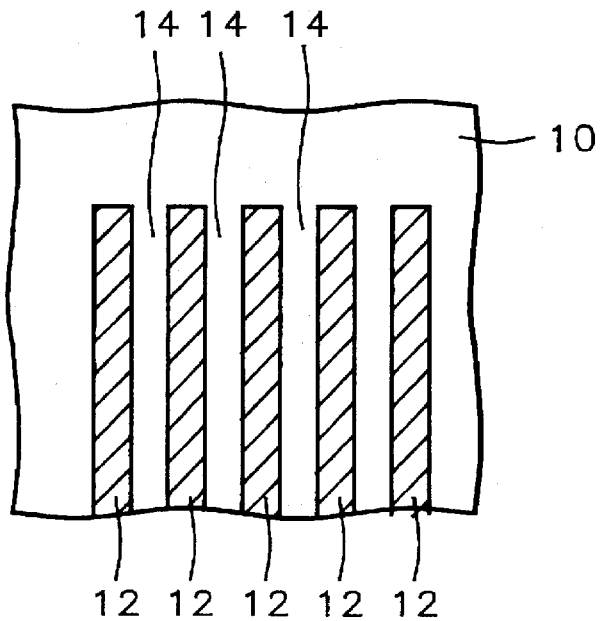
FIG. 1 - Prior Art
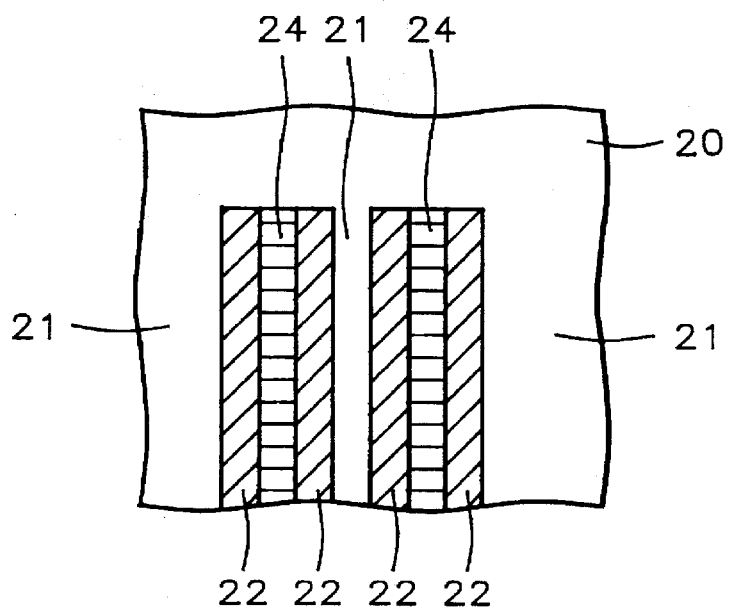
FIG. 2A - Prior Art

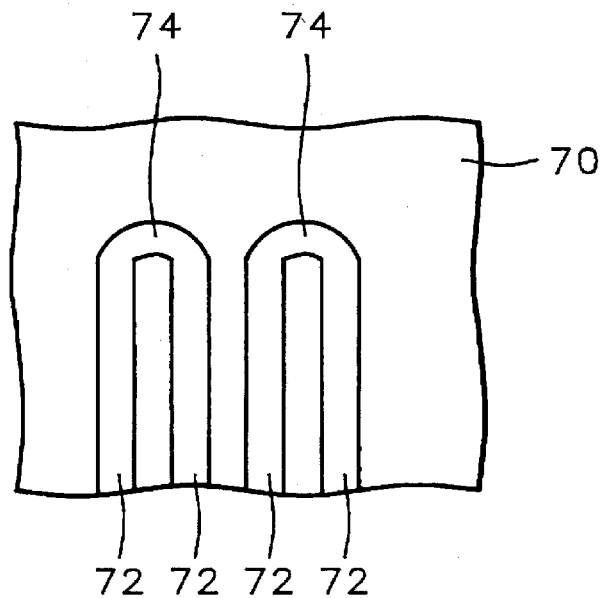
FIG. 2B
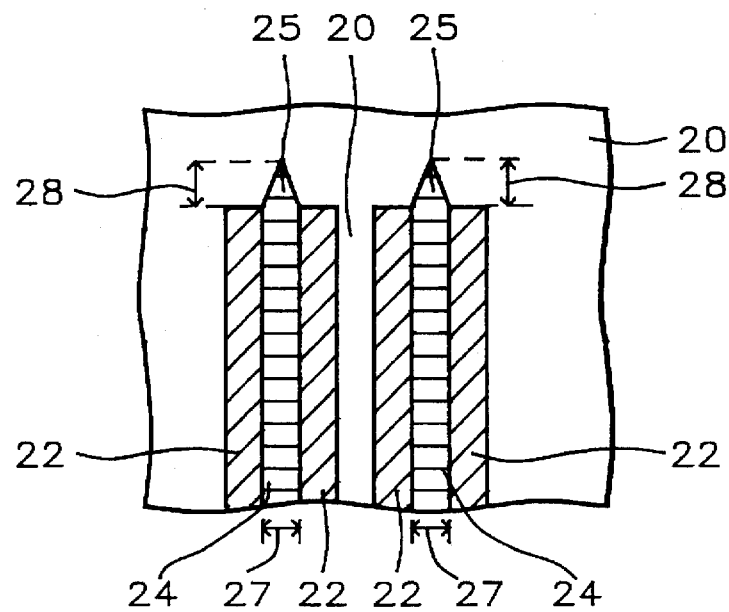
FIG. 3A - Prior Art

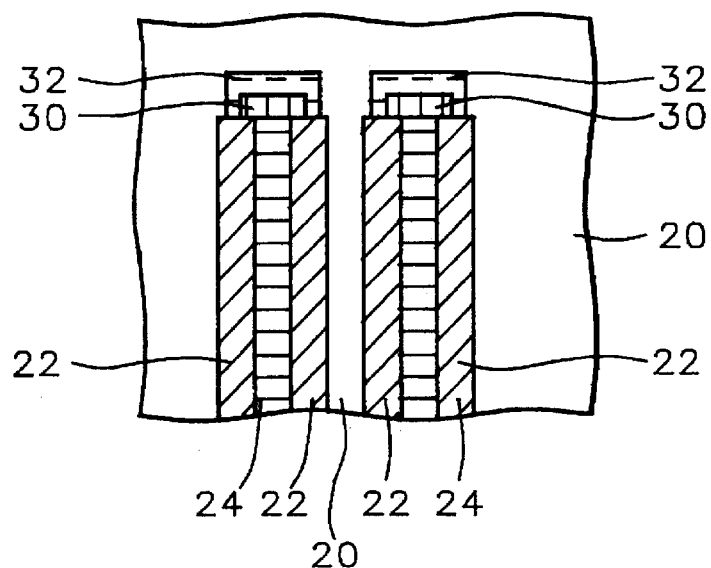
FIG. 3B – Prior Art
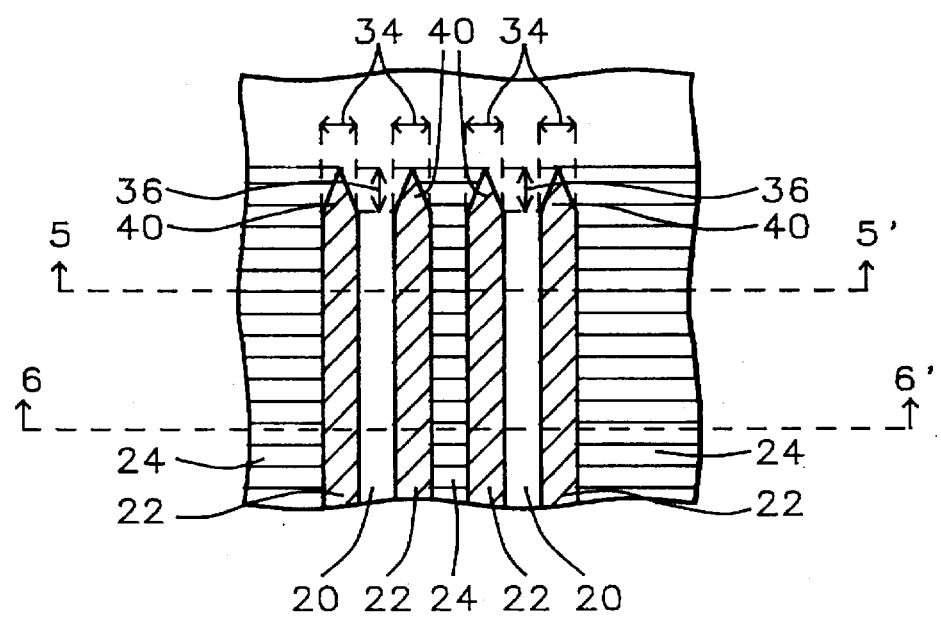
FIG. 4

MASKS AND METHODS OF FORMING MASKS WHICH AVOID PHASE CONFLICT PROBLEMS IN PHASE SHIFTING MASKS

BACKGROUND OF THE INVENTION

(1) Field of the Invention

The invention deals with avoiding phase conflict problems in phase shifting masks and more particularly with avoiding bridging problems between bright field line and space patterns exposed on wafers using positive photoresist due to phase conflict in Levenson's phase shifting mask patterns.

(2) Description of the Related Art

In forming a number of closely spaced parallel equal line and space bright field patterns on a semiconductor integrated circuit wafer phase shifting masks are often used, especially when the pattern size is beyond the resolution limit of the exposure wavelength. Phase conflict between regions of 0° phase shift and regions of 180° phase shift cause problems of bridging at the ends of the patterns.

U.S. Pat. No. 5,468,578 to Rolfson describes methods of forming mask patterns using a mask pattern of opaque areas and transparent areas to connect adjacent transparent areas of a mask pattern so that phase conflict is avoided.

U.S. Pat. No. 5,318,868 to Hasegawa et al. uses phase shifting material of different transmittance in different regions of the mask to avoid phase conflict problems.

A paper "Phase-Shifting Mask Strategies: Isolated Dark Lines" by Marc D. Levenson, Microlithography World, March/April 1992, pages 6–12 describes methods of patterning isolated dark lines. Bridging at phase transitions is discussed as is the use of fine points at the end of phase shifting regions to control bridging.

A paper "Phase-Shifting Mask Strategies: Line-Space Patterns" by Marc D. Levenson, Microlithography World, September/October 1992, pages 6–12 describes methods of patterning line space patterns. Bridging at phase transitions is discussed briefly as is the use of additional phase shift layers of 60° and 120° to control bridging.

The invention of this Patent Application describes a phase shifting mask which will avoid phase conflict problems by forming an opaque fine point at the end of finely spaced parallel opaque lines. Fine points at the end of phase shifting regions have the problem of residual resist left on the semiconductor wafer when the mask is used to form equal line and space bright field patterns. This problem is avoided using an opaque fine point at the end of finely spaced parallel opaque lines. Methods of forming the phase shifting mask are also described.

SUMMARY OF THE INVENTION

As minimum feature sizes for the manufacture of semiconductor integrated circuit wafers shrink into the deep sub-micron region, increased resolution demands are placed on masks used in photolithographic processing. Phase shifting masks are often used to improve the resolution limit of these masks.

In cases where the pattern to be transferred from the mask to a wafer comprises a series of parallel lines a grating pattern, having a series of parallel lines, may be used. In these cases the mask comprises a series of parallel opaque lines with spaces between. A prior art mask of this type is shown in FIG. 1 where parallel opaque lines 12, having spaces 14 between them, are formed on a transparent mask substrate 10. The opaque lines 12 are indicated by diagonal shading.

In order to improve the resolution of the type of mask shown in FIG. 1 phase shifting material is often used. As shown in FIG. 2A, parallel opaque lines 22 are formed on a transparent substrate 20. Phase shifting material 24 is formed in the spaces between alternate pairs of lines. In FIG. 2A, as will be the case in all top view diagrams of masks in this disclosure, opaque regions will be indicated with diagonal shading, phase shifting regions will be indicated with horizontal shading, and transparent regions with 0° phase shift will have no shading. As shown in FIG. 2A the remaining spaces 21 between the opaque line 22 or adjacent to the outermost opaque lines have transparent material only. This type of mask is often referred to as a Levenson or alternating aperture phase shift mask.

There is a problem with the alternating aperture mask shown in FIG. 2A when used with a positive resist on the semiconductor wafer caused by phase conflict at the ends of the lines. The phase conflict is due to the abrupt change from phase shifting material to transparent material at the ends of the line pairs having phase shifting material between them. As shown in FIG. 2B this phase conflict causes a bridging pattern 74 at the ends of the lines 72 formed on the semiconductor wafer 70.

It is a principle objective of this invention to provide a phase shifting mask for forming parallel lines which avoids phase conflict problems and bridging at the ends of the lines.

It is a further principle objective of this invention to provide a method of forming a phase shifting mask for forming parallel lines which avoids phase conflict problems and bridging at the ends of the lines.

These objectives are achieved with a phase shifting mask which has an opaque fine tip, or triangular segments, at the ends of the opaque lines of the phase shifting mask.

Other methods have been used to avoid phase conflict problems at the end of an opaque line. FIG. 3A shows the top view of a mask using a phase fine tip which uses triangular sections at the end of the phase shifting regions of the mask. FIG. 3B shows the top view of a mask using 60° and 120° phase shift steps at the end of the phase shifting regions of the mask.

FIG. 3A shows a top view of a mask using a phase fine tip to avoid phase conflict problems. The phase shifting material 24, providing a 180° phase shift, is indicated by horizontal shading. The opaque material 22 is indicated by diagonal shading. The opaque lines 22 and phase shifting lines 24 are formed on a transparent mask substrate 20. A triangular section 25, having a base 27 and a height 28, is formed at the end of the phase shifting line. When the ratio of the height 28 to the base width 27 is equal to about three the bridging problem at the end of the line is avoided. This method has the problem of residual resist left on the semiconductor wafer when the mask is used to form equal line and space bright field patterns.

FIG. 3B shows a top view of a mask using 60° phase shift regions 32 and 120° phase shift regions 30 at the end of the 180° phase shifting lines 24 formed on a transparent mask substrate 20. In FIG. 3B the opaque regions 22 are shown using diagonal shading, 180° phase shift regions 24 are shown using horizontal shading, 120° phase shift regions 30 are shown using vertical shading, and 60° phase shift regions 32 are shown using horizontal dashed shading. In this mask the gradual transition from 180° phase shift to 0° phase shift avoids the phase conflict problem. This method has the problems of cost and complexity due to the extra levels of phase shift, 60° and 120°, that must be formed.

This invention uses a phase shifting mask which has an opaque fine tip, or triangular segment, at the ends of the opaque lines of the phase shifting mask. The opaque fine tip avoids the phase conflict problems and avoids the problems of residual photoresist and extra phase shift levels of 60° and 120°.

BRIEF DESCRIPTION OF THE DRAWINGS

FIG. 1 shows a top view of a prior art mask having parallel opaque lines for forming parallel lines and spaces on a semiconductor wafer, often referred to as a binary or chrome mask.

FIG. 2A shows a top view of a prior art mask having parallel opaque lines with phase shifting material between pairs of opaque lines, often referred to as a Levenson Phase Shifting Mask or alternative Phase Shifting Mask.

FIG. 2B shows a top view of bridging between adjacent parallel lines on a semiconductor wafer formed using the prior art mask of FIG. 2A.

FIG. 3A shows a top view of a prior art mask using fine phase tips to avoid phase conflict problems.

FIG. 3B shows a top view of a prior art mask using 60° and 120° phase regions to avoid phase conflict problems.

FIG. 4 shows a top view of the phase shift mask using opaque fine tips of this invention.

DESCRIPTION OF THE PREFERRED EMBODIMENTS

Figure 5:
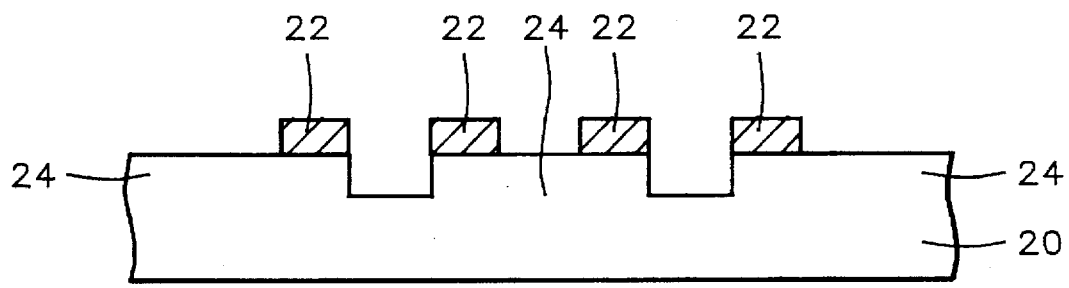
FIG. 5 is a cross section along the line 5–5' of FIG. 4 of a phase shift mask using opaque fine tips of this invention wherein different thicknesses of the transparent mask substrate forms the 180° phase shifting pattern.
Figure 6:
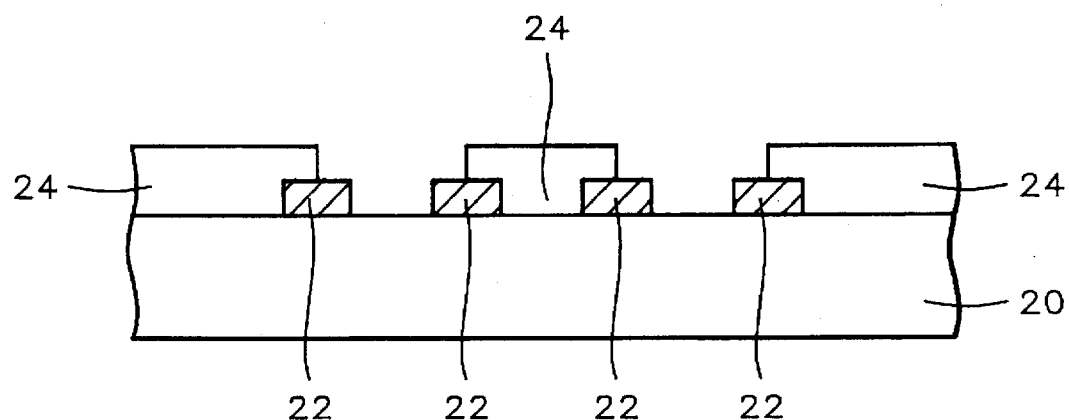
FIG. 6 is a cross section along the line 6–6' of FIG. 4 of a phase shift mask using opaque fine tips of this invention wherein a patterned layer of phase shifting material over the transparent mask substrate forms the 180° phase shifting pattern.

Refer now to FIGS. 4–6, there is shown an embodiment of the phase shifting mask using fine opaque tips of this invention. FIG. 4 shows parallel opaque lines 22, formed of a material such as chrome, formed on a transparent mask substrate 20 such as quartz. In FIG. 4 opaque regions are indicated using diagonal shading and 180° phase shifting regions are indicated using horizontal shading. There is a triangular segment 40 formed at the end of each of the parallel opaque lines 22, wherein each triangular segment 40 has a base width which is equal to the width 34 of the parallel opaque lines 22 and a height 36. Regions of phase shifting material 24, having a phase shift of about 180° for the light used to illuminate the mask, is formed between pairs of parallel opaque lines 22 such that each opaque line 22 is adjacent to only one region of phase shifting material 24 and one region of transparent material 20. The end of each region of phase shifting material 24 widens to fill the region between the corresponding opaque fine tips 40.

The mask of FIG. 4 is used to form parallel lines and spaces on a semiconductor wafer using positive photoresist to form the lines and spaces pattern. When the ratio of the height 36 to the base width 34 of the opaque fine tips is between about two and five the opaque fine tips prevent the abrupt phase shift between regions of 0° phase shift and regions of 180° phase shift from causing bridging between the ends of adjacent lines.

FIG. 5 shows a cross section, along the line 5–5' of FIG. 4, of a phase shift mask using opaque fine tips wherein the phase shift pattern is etched into the transparent mask substrate and the different thicknesses of the transparent mask substrate provides 180° difference in phase shift. In this mask parts of the transparent mask substrate, a material such as quartz, are etched away so that the transparent substrate material 24 is used to form the phase shifting regions. The opaque regions 22 are formed of a material such as chrome. FIG. 6 shows a cross section, along the line 6–6' of FIG. 4, of a phase shift mask using opaque fine tips wherein phase shifting material is formed over the transparent mask substrate to provide 180° difference in phase shift. In this mask a pattern of phase shifting material 24, such as silicon dioxide or spin-on-glass, is formed on the transparent mask substrate 20 between pairs of opaque lines 22. The thickness of the phase shifting material 24 is adjusted to provide a phase shift of about 180° at the wavelength of the light used to illuminate the mask, such as an i-line of 365 nanometers, krypton fluoride of 248 nanometers, or argon fluoride of 193 nanometers.

Figure 7:
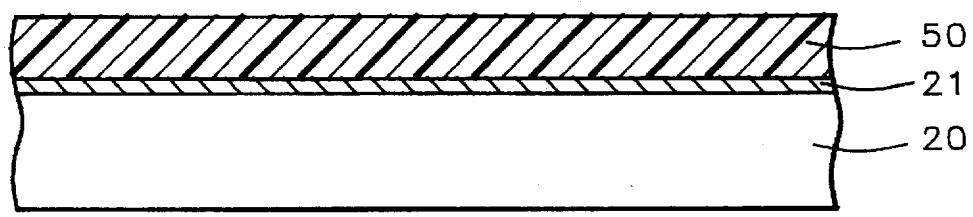
FIG. 7 shows a cross section of a layer of opaque material and a layer of photoresist formed on a transparent mask substrate.
Figure 8:
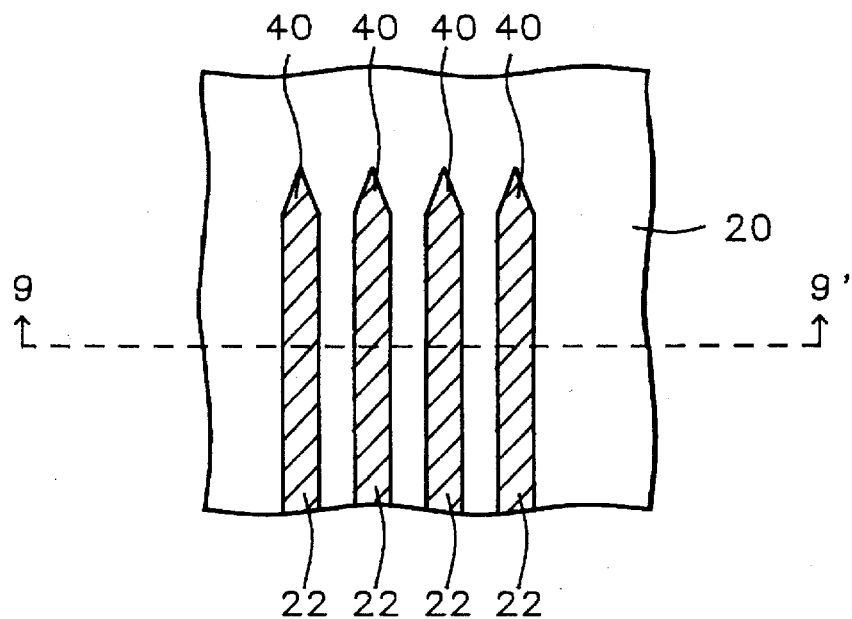
FIG. 8 shows a top view of opaque fine tips formed at the end of opaque lines for the mask of this invention.
Figure 9:
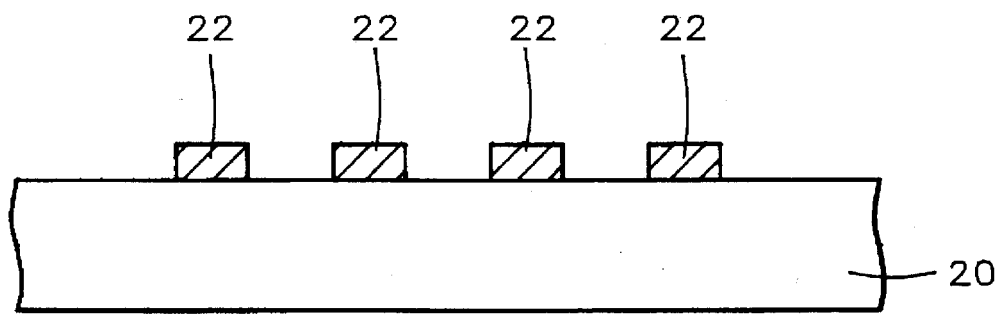
FIG. 9 shows a cross section along the line 9–9' of FIG. 8.

Refer now to FIGS. 7–12, there is shown an embodiment of a method of forming the phase shifting mask with opaque fine tips of this invention wherein the phase shift pattern is etched into the transparent mask substrate and the different thicknesses of the transparent mask substrate provides 180° difference in phase shift. As shown in FIG. 7, an opaque layer 21 of a material such as chrome having a thickness of between about 800 and 1400 Angstroms is formed on a transparent mask substrate 20. The transparent substrate 20 is a material such as quartz having a thickness of about 0.090 inches for a 5 inch reticle or about 0.25 inches for a 6 inch reticle. A layer of photoresist 50 is formed on the layer of opaque material 21. The pattern for the opaque material of parallel opaque lines and opaque fine tips is then formed in the layer of photoresist 50 using electron beam exposure methods. Using the photoresist pattern as a mask the pattern is formed in the opaque chrome layer using wet etching methods. FIG. 8 shows the opaque parallel lines 20 and opaque fine tips 40 formed in the opaque material on the transparent mask substrate 20. FIG. 9 shows a cross section of the opaque lines 22 formed on the transparent mask substrate 20 taken along the line 9–9' of FIG. 8.

Figure 10:
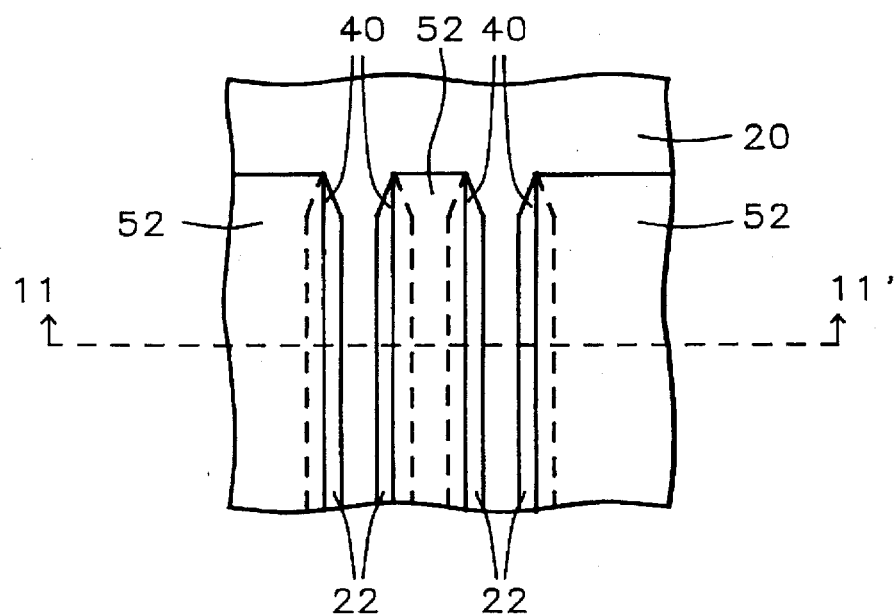
FIG. 10 shows a top view of a photoresist pattern formed over opaque lines on a transparent mask substrate in order to form a 180° phase shifting pattern by etching the transparent mask substrate.
Figure 11:
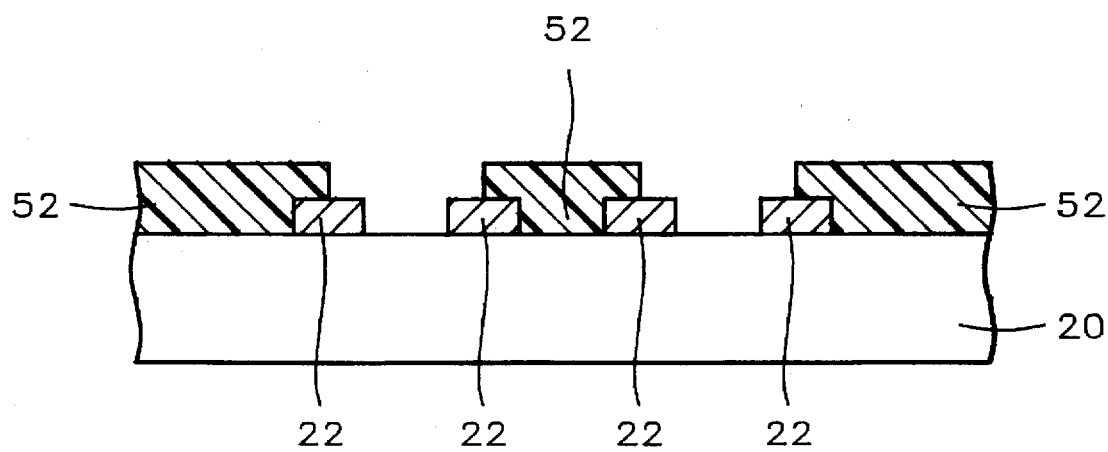
FIG. 11 shows a cross section view along the line 11–11' of FIG. 10.
Figure 12:
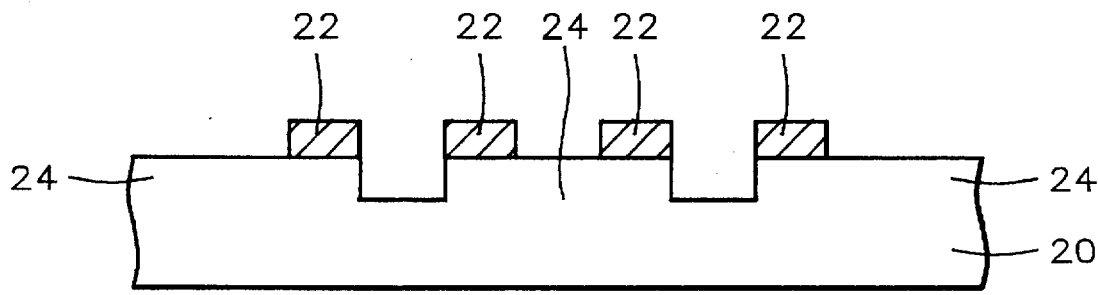
FIG. 12 shows a cross section view of the completed phase shifting mask of this invention using etching into the transparent mask substrate to form a 180° phase shifting pattern.

Next, as shown in FIGS. 10 and 11, a photoresist pattern 52 is formed over those regions of the transparent mask substrate where extra thickness of the transparent mask substrate will provide 180° phase shift. The photoresist pattern 52 is formed using electron beam exposure of a layer of photoresist. A cross section view of the photoresist pattern 52 formed over the opaque parallel lines 22 on the transparent mask substrate 20, taken along the line 11–11' of FIG. 10, is shown in FIG. 11. Next, as shown in FIG. 12, that part of the transparent mask substrate 20 not covered by the photoresist pattern is partially etched away using dry anisotropic etching and the photoresist is stripped. Part of the parallel opaque line pattern 22 forms a part of the etching mask making the etching self aligned to the pattern formed in the opaque material. The anisotropic dry etching of the transparent mask substrate is controlled to remove an amount of material which would have provided a 180° phase shift for light of the wavelength used to illuminate the completed mask. The unetched part of the transparent mask substrate 24 provides the 180° phase shift in the completed mask.

Figure 13:
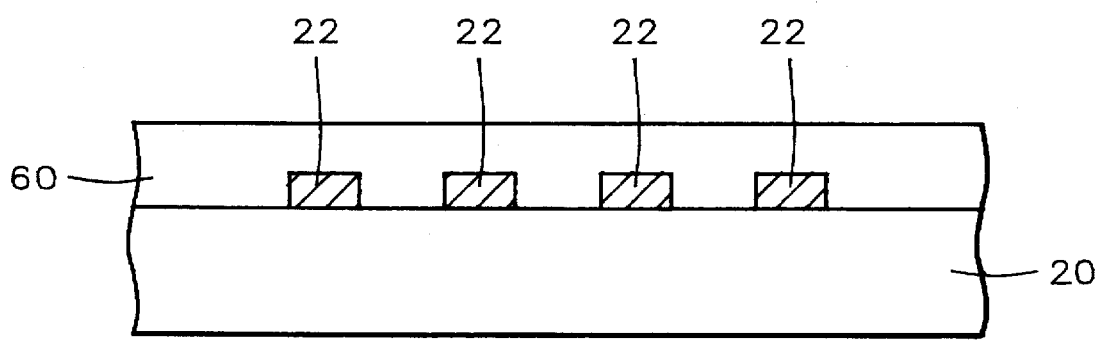
FIG. 13 shows a cross section view of opaque lines formed on a transparent mask substrate with a layer of phase shifting material over the transparent mask substrate and opaque lines.
Figure 14:
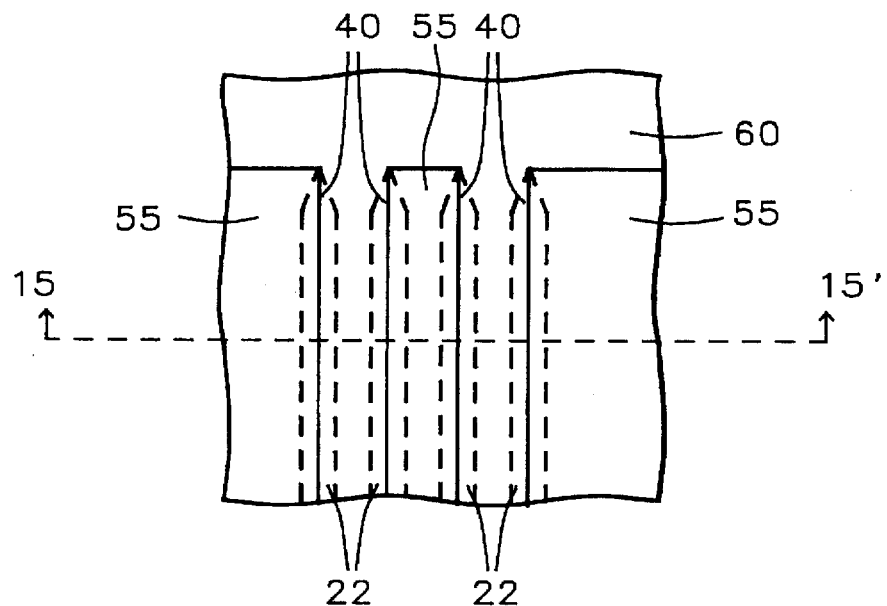
FIG. 14 shows a top view of a photoresist pattern formed over the opaque lines and layer of phase shifting material of FIG. 13 in order to etch a 180° phase shifting pattern in the layer of phase shifting material.
Figure 15:
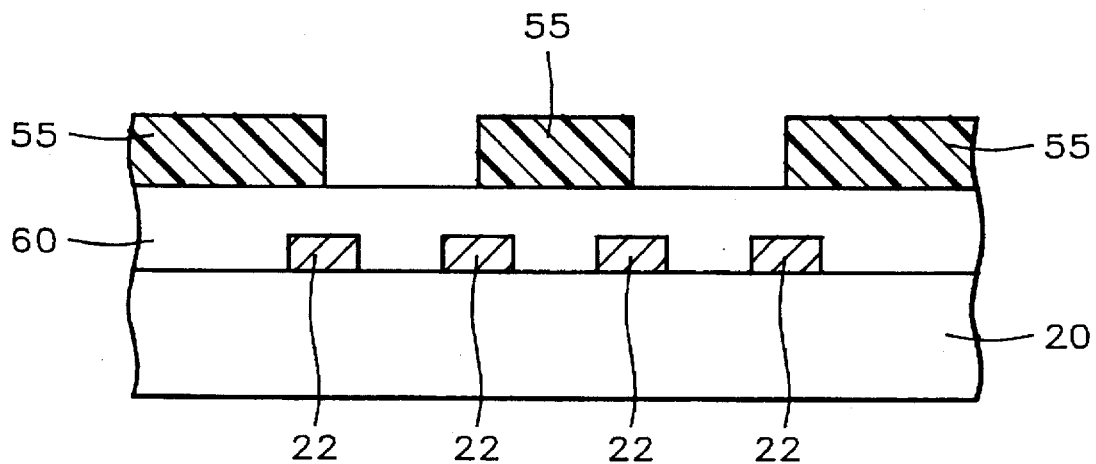
FIG. 15 shows a cross section view along the line 15–15' of FIG. 14.

Refer now to FIGS. 7–9 and 13–16, there is shown an embodiment of a method of forming the phase shift mask using opaque fine tips wherein phase shifting material is formed over the transparent mask substrate to provide 180° difference in phase shift. The pattern of opaque parallel lines with opaque fine tips is formed as described in the preceding embodiment, see FIGS. 7–9. Next as shown in FIG. 13 a layer of phase shifting material 60 is formed on the transparent mask substrate 20 covering the opaque lines 22. The phase shifting material is a material such as silicon dioxide or spin-on-glass and has a thickness which will provide a 180° phase shift for a wavelength of the light used to illuminate the completed mask. Next a photoresist pattern 55 is formed over the layer of phase shifting material covering those regions of the phase shifting material where phase shifting material will be left to provide 180° phase shift, see FIGS. 14 and 15. The photoresist pattern is formed using electron beam exposure and development of a layer of photoresist.

Figure 16:
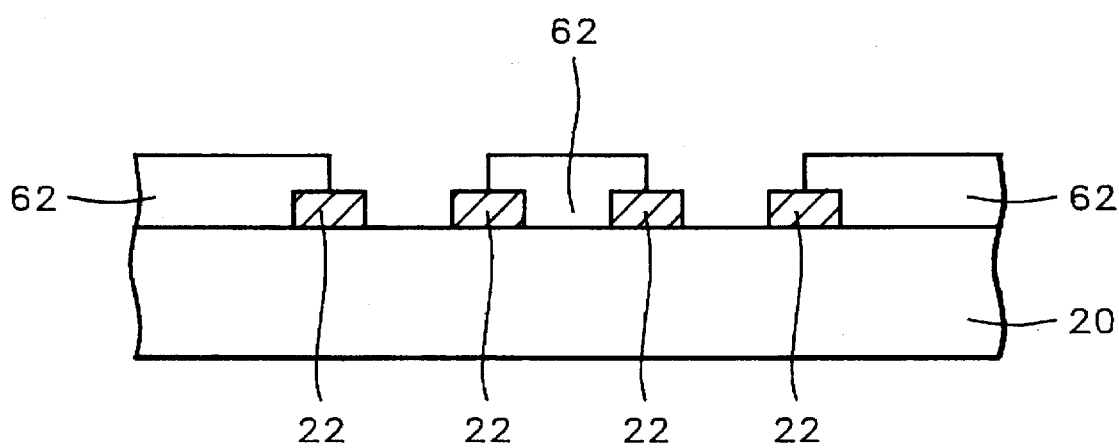
FIG. 16 shows a cross section view of the completed phase shifting mask of this invention using a 180° phase shifting pattern etched into the layer of phase shifting material.

Next, as shown in FIG. 16, that part of the layer of phase shifting material 62 not covered by the photoresist is etched away using dry anisotropic etching and the photoresist is removed. Phase shifting material remains over regions of the transparent substrate 20 between alternating pairs of adjacent parallel opaque lines 22 and opaque fine tips. The phase shifting material 62 covers a part of the opaque parallel lines 22 making the location of the edge of the phase shifting material non critical. The phase shifting material 62 provides 180° phase shift While the invention has been particularly shown and described with reference to the preferred embodiments thereof, it will be understood by those skilled in the art that various changes in form and details may be made without departing from the spirit and scope of the invention.

What is claimed is:

1. A phase shifting mask, comprising:

a transparent substrate;

a number of parallel opaque patterns formed on said transparent substrate wherein each said opaque pattern comprises two parallel sides, a width equal to the distance between said two parallel sides, an end perpendicular to said two parallel sides, and a triangular region extending from said end wherein said triangular region has a base and a height and said base of said triangular region is formed by said end;

a number of phase shifting patterns formed on said transparent substrate wherein each of said phase shifting patterns is adjacent to one of said opaque patterns; and a number of transparent patterns formed on said transparent substrate wherein each said transparent pattern is adjacent to one of said opaque patterns.

2. The phase shifting mask of claim 1 wherein said transparent substrate is quartz.

3. The phase shifting mask of claim 1 wherein said opaque patterns are formed from chrome.

4. The phase shifting mask of claim 1 wherein said width is between about 0.5 and 2.5 microns.

5. The phase shifting mask of claim 1 wherein said height divided by said width is between about 2 and 5.

6. The phase shifting mask of claim 1 wherein said phase shifting patterns are formed from spin on glass.

7. The phase shifting mask of claim 1 wherein said phase shifting patterns provide a phase shift of about 180° for light having a wavelength of about 365 nanometers.

8. The phase shifting mask of claim 1 wherein said phase shifting patterns provide a phase shift of about 180° for light having a wavelength of about 248 nanometers.

9. The phase shifting mask of claim 1 wherein said phase shifting patterns provide a phase shift of about 180° for light having a wavelength of about 193 nanometers.

10. A method of forming a phase shifting mask, comprising the steps of:

providing a transparent substrate;

forming a layer of opaque material on said transparent substrate;

forming a first layer of photoresist on said layer of opaque material;

forming a first pattern in said first layer of photoresist;

forming said first pattern in said layer of opaque material by means of etching using said first pattern in said first layer of photoresist as a mask thereby forming a number of opaque material first pattern elements wherein each said opaque material first pattern element comprises two parallel sides, a width equal to the distance between said two parallel sides, an end perpendicular to said two parallel sides, and a triangular region extending from said end wherein said triangular region has a base and a height and said base of said triangular region is formed by said end;

removing said first pattern formed in said first layer of photoresist;

forming a second layer of photoresist over said transparent substrate covering said first pattern formed in said layer of opaque material;

forming a second pattern in said second layer of photoresist wherein said second pattern in said second layer of photoresist comprises a number of second pattern elements wherein each said second pattern element in said second layer of photoresist covers that part of said transparent substrate between two adjacent said opaque material first pattern elements and contacts said two adjacent said opaque material first pattern elements whereby each said opaque material first pattern element is contacted by only one said second pattern element in said second layer of photoresist;

etching away a first depth of that part of said transparent substrate not covered by said first pattern formed in said layer of opaque material or said second pattern formed in said second layer of photoresist; and removing said second pattern formed in said second layer of photoresist.

11. The method of claim 10 wherein said transparent substrate is quartz.

12. The method of claim 10 wherein said opaque material is chrome.

13. The method of claim 10 wherein said width is between about 0.5 and 2.5 microns.

14. The method of claim 10 wherein said height divided by said width is between about 2 and 5.

15. The method of claim 10 wherein said first depth of said transparent substrate provides a phase shift of about 180° for light having a wavelength of about 365 nanometers.

16. The method of claim 10 wherein said first depth of said transparent substrate provides a phase shift of about 180° for light having a wavelength of about 248 nanometers.

17. The method of claim 10 wherein said first depth of said transparent substrate provides a phase shift of about 180° for light having a wavelength of about 193 nanometers.

18. A method of forming a phase shifting mask, comprising the steps of:

providing a transparent substrate;

forming a layer of opaque material on said transparent substrate;

forming a first layer of photoresist on said layer of opaque material;

forming a first pattern in said first layer of photoresist;

forming said first pattern in said layer of opaque material by means of etching using said first pattern in said first layer of photoresist as a mask thereby forming a number of opaque material first pattern elements wherein each said opaque material first pattern element comprises two parallel sides, a width equal to the distance between said two parallel sides, an end perpendicular to said two parallel sides, and a triangular region extending from said end wherein said triangular region has a base and a height and said base of said triangular region is formed by said end;

removing said first pattern formed in said first layer of photoresist;

forming a layer of phase shifting material over said transparent substrate covering said first pattern formed in said layer of opaque material;

forming a second layer of photoresist over said layer of phase shifting material;

forming a second pattern in said second layer of photoresist wherein said second pattern in said second layer of photoresist comprises a number of second pattern elements wherein each said second pattern element in said second layer of photoresist covers that part of said transparent substrate between two adjacent said opaque material first pattern elements and covers part of two adjacent said opaque material first pattern elements whereby said part of each said opaque material first pattern element is covered by only one said second pattern element in said second layer of photoresist;

etching away that part Of said phase shifting material not covered by said second pattern formed in said second layer of photoresist; and removing said second pattern formed in said second layer of photoresist.

19. The method of claim 18 wherein said transparent substrate is quartz.

20. The method of claim 18 wherein said opaque material is chrome.

21. The method of claim 18 wherein said width is between about 0.5 and 2.5 microns.

22. The method of claim 18 wherein said height divided by said width is between about 2 and 5.

23. The method of claim 18 wherein said phase shifting material is spin on glass.

24. The method of claim 18 wherein said phase shifting material is silicon dioxide.

25. The method of claim 18 wherein said phase shifting material has a thickness which provides a phase shift of about 180° for light having a wavelength of about 365 nanometers.

26. The method of claim 18 wherein said phase shifting material has a thickness which provides a phase shift of about 180° for light having a wavelength of about 248 nanometers.

27. The method of claim 18 wherein said phase shifting material has a thickness which provides a phase shift of about 180° for light having a wavelength of about 193 nanometers.

* * * * *